(12) United States Patent
Ingalz et al.

(10) Patent No.: US 12,033,908 B2
(45) Date of Patent: Jul. 9, 2024

(54) TRANSISTOR PACKAGE COMPRISING THERMALLY CONDUCTIVE AND ELECTRICALLY INSULATING LAYER

(71) Applicant: Lunar Energy, Inc., Mountain View, CA (US)

(72) Inventors: Charles Ingalz, San Jose, CA (US); Bozhi Yang, Los Altos, CA (US)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/329,220

(22) Filed: Jun. 5, 2023

(65) Prior Publication Data

US 2023/0395447 A1    Dec. 7, 2023

Related U.S. Application Data

(60) Provisional application No. 63/349,403, filed on Jun. 6, 2022.

(51) Int. Cl.
*H01L 23/31* (2006.01)
*H01L 23/373* (2006.01)
*H01L 23/40* (2006.01)

(52) U.S. Cl.
CPC ...... *H01L 23/3107* (2013.01); *H01L 23/3735* (2013.01); *H01L 23/4006* (2013.01); *H01L 2023/4081* (2013.01)

(58) Field of Classification Search
CPC .................................................... H01L 23/3107
USPC ......................................................... 257/712
See application file for complete search history.

(56) References Cited

U.S. PATENT DOCUMENTS

| 6,490,161 | B1 * | 12/2002 | Johnson | ............... H01L 23/433 |
| | | | | 257/E23.09 |
| 10,586,756 | B2 * | 3/2020 | Roth | ................ H01L 23/49531 |
| 2018/0122729 | A1 * | 5/2018 | Ping | ...................... H01L 23/04 |

FOREIGN PATENT DOCUMENTS

JP          3308819 B2 *  7/2002

* cited by examiner

*Primary Examiner* — Ajay Arora
(74) *Attorney, Agent, or Firm* — Van Pelt, Yi & James LLP

(57) ABSTRACT

Embodiments of a transistor package construction is disclosed, including: a transistor comprising: a source; and a drain; and a package comprising: a metallic back surface that is electrically connected to the drain; a top surface comprising a notch; and a thermally conductive and electrically insulating layer covering at least a portion of the metallic back surface of the package.

11 Claims, 11 Drawing Sheets

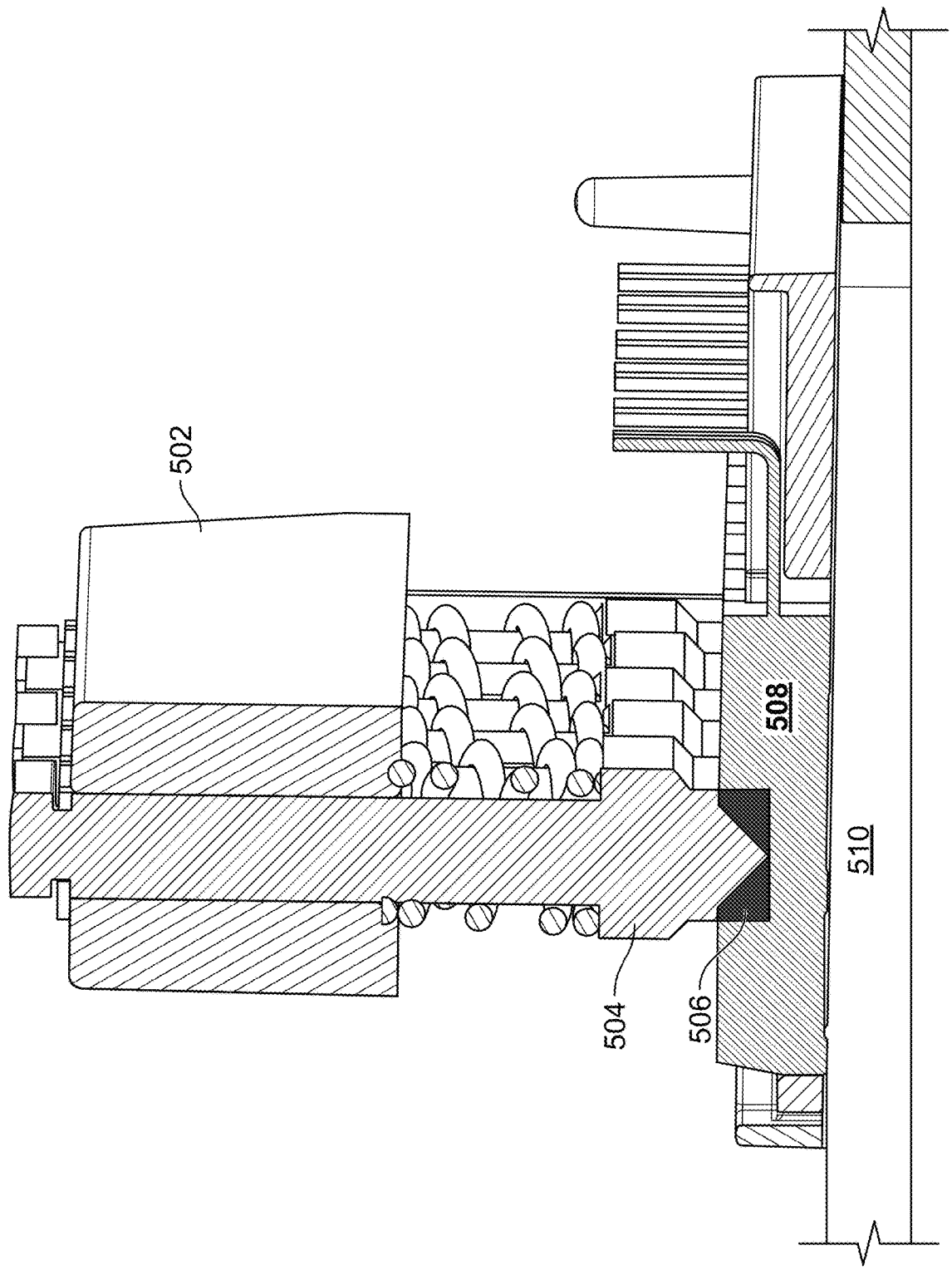

TRANSISTOR PACKAGE COMPRISING THERMALLY CONDUCTIVE AND ELECTRICALLY INSULATING LAYER

CROSS REFERENCE TO OTHER APPLICATIONS

This application claims priority to U.S. Provisional Patent Application No. 63/349,403 entitled TRANSISTOR PACKAGE CONSTRUCTION filed Jun. 6, 2022 which is incorporated herein by reference for all purposes.

BACKGROUND OF THE INVENTION

A metallic surface of an electronic component (e.g., a transistor) can have a high voltage, which results in the component generating significant heat. It is desirable to draw heat from the heat generating electronic component using a heat sink to improve its performance and life and those of the components around it. However, given that the metallic surface of an electronic component could be at a non-zero voltage, it is also desirable to electrically insulate the metallic surface of the electronic component, while also improving the transfer of heat from that surface to the heat sink.

BRIEF DESCRIPTION OF THE DRAWINGS

Various embodiments of the invention are disclosed in the following detailed description and the accompanying drawings.

FIG. 5 is a diagram showing a cross-sectional view of a mechanism that provides a clamp force on a transistor package in accordance with some embodiments.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
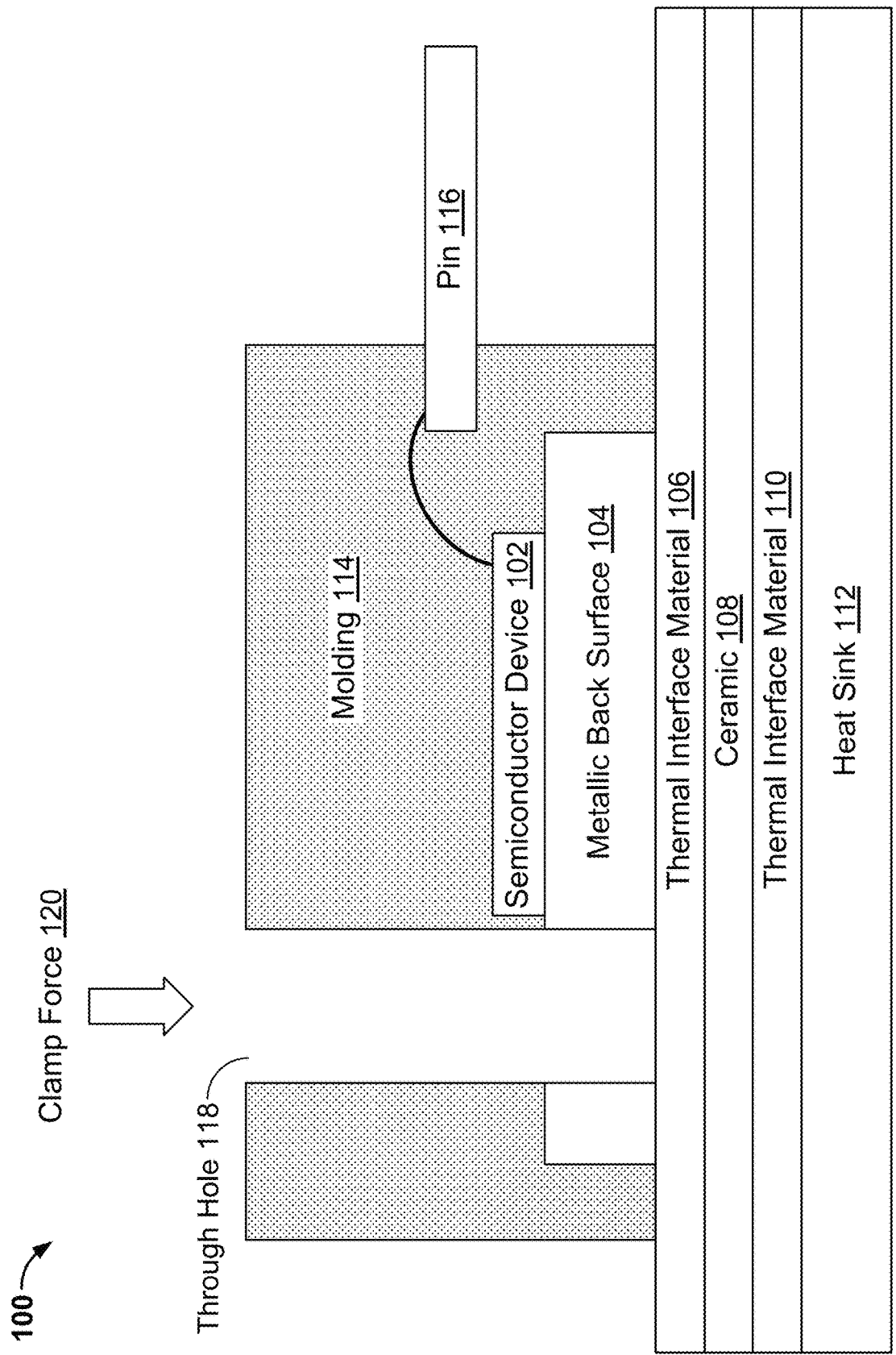
FIG. 1 is a diagram showing a length-wise cross-sectional view of a conventional transistor package.

FIG. 1 is a diagram showing a length-wise cross-sectional view of a conventional transistor package. Conventional transistor package 100 includes semiconductor device 102, metallic back surface 104, pin 116, and molding 114. Molding 114, which is made of electrically insulating material such as plastic, includes through-hole 118 with a first opening at the top surface of molding 114 and a second opening at metallic back surface 104 of transistor package 100. Due to the operation of semiconductor device 102, semiconductor device 102 is very hot and it is desired to draw this heat away from metallic back surface 104 to heat sink 112. However, given that metallic back surface 104 sits at a (e.g., high) voltage, it is desired for metallic back surface 104 to be electrically isolated from heat sink 112 to prevent an undesirable flow of current. As such, ceramic 108 is placed between metallic back surface 104 and heat sink 112 to provide thermal conductivity but electrical insulation between the two layers. Through-hole 118 is used to thread through a fastener that can couple conventional transistor package 100 to a surface (e.g., heat sink 112) or guide a downward force (e.g., clamp force 120) that will press conventional transistor package 100 toward ceramic 108. Thermal interface material 106 can be applied to metallic back surface 104 to provide lower thermal resistance (and improve thermal conductivity) between metallic back surface 104 and ceramic 108. Ceramic 108 can help spread the heat from metallic back surface 104 to heat sink 112. Thermal interface material 110 can sit in between ceramic 108 and heat sink 112 to reduce the thermal resistance (and improve thermal conductivity) between the two adjacent layers. Three pins (only one of which is shown in FIG. 1, pin 116) are wire bonded to the source, gate, and drain (not shown) of semiconductor device 102 and can be soldered or otherwise connected to a circuit board.

However, drawbacks exist with respect to the design of conventional transistor package 100 of FIG. 1. A first drawback is that through-hole 118 is not centered over the top surface of molding 114/semiconductor device 102 and therefore, clamp force 120 that may be inserted, at least in part, into through-hole 118 is not uniformly distributed across the top surface of conventional transistor package 100. A lack of uniform force distribution across the top surface of conventional transistor package 100 could cause an end of conventional transistor package 100 to lift away from thermal interface material 106 and/or ceramic 108. In the event that an end of conventional transistor package 100 lifts away from thermal interface material 106 and/or ceramic 108, air pockets can be introduced between metallic back surface 104 and thermal interface material 106 or between thermal interface material 106 and ceramic 108, either of which would ultimately degrade the thermal conductivity between metallic back surface 104 and ceramic 108. A second drawback is that because through-hole 118 opens at metallic back surface 104, through-hole 118 reduces the overall area of the metal on metallic back surface 104, which reduces the total heat transfer area between metallic back surface 104 and ceramic 108. A third drawback is that thermal interface material layers 106 and 110 lower the thermal resistance between its adjacent layers but do not entirely eliminate pockets of air that could still add undesirable thermal resistance that hinders the transfer of heat from metallic back surface 104 to ceramic 108.

Embodiments of a transistor package construction are described herein. A transistor (e.g., a metal-oxide-semiconductor field-effect transistor (FET), a gallium nitride (GaN) FET, or a silicon carbide (SiC) FET) includes a source, a gate, a drain, and a metallic back surface that sits at the same voltage as the drain. The voltage at the drain and at the metallic back surface of the transistor is high (e.g., a low-voltage SiC FET can have a voltage range of 200-600V, a medium-voltage SiC FET can have a voltage range of 600-1200V, and a high-voltage SiC FET can have a voltage range that exceeds 1200V), which leads to a high current and also high heat generation. In various embodiments, an electrically insulating but thermally conductive layer (e.g., a ceramic or a dielectric layer) is added to the metallic back surface of the transistor in the transistor package. In some embodiments, the electrically insulating but thermally conductive layer is deposited (e.g., via plasma-enhanced chemical vapor deposition) onto the metallic back surface of the transistor in the package to minimize the amount of thermal resistance between the two layers. For example, a thermal interface material can then be added in between the electrically insulating but thermally conductive layer and a heat sink to better assist in the transfer of heat from the transistor and to the heat sink. In some embodiments, a molding (if applicable) over the transistor in the package includes a notch that is to engage with a mechanism that exerts a force towards the metallic back surface of the transistor. The notch may comprise one or more recesses and none of such recesses extend to/open at the back surface of the package. Another benefit of using one or more multiple recesses with potentially non-circular cross-sections is this design can reduce the risk of rotation of the transistor package. In various embodiments, the notch is placed over the transistor within the package and/or is otherwise centered over the top surface of the molding. The centered notch/notch placed over the transistor will engage a mechanism and allow that mechanism to clamp against the transistor package to distribute the force more uniformly and therefore remove thermal resistance (e.g., air) between the electrically insulating but thermally conductive layer and the heat sink. In some embodiments, the mechanism that clamps down against the notch of the transistor package comprises a gantry assembly that supports at least one spring-loaded pin, which engages the notch.

Figure 2:
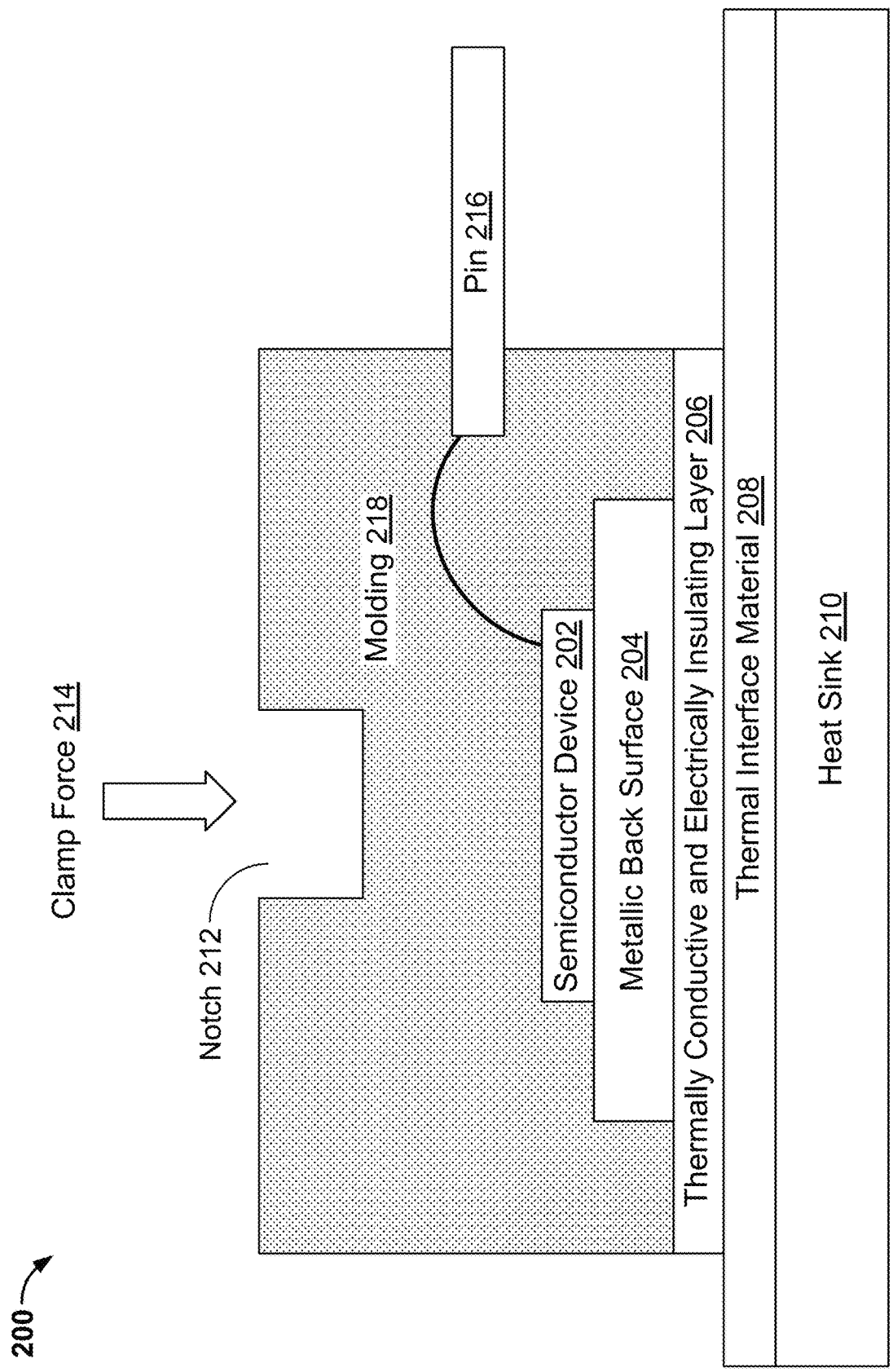
FIG. 2 is a diagram showing a length-wise cross-sectional view of a transistor package in accordance with some embodiments.

FIG. 2 is a diagram showing a length-wise cross-sectional view of a transistor package in accordance with some embodiments. Transistor package 200 includes semiconductor device 202, metallic back surface 204, pin 216, molding 218, and thermally conductive and electrically insulating layer 206. In some embodiments, transistor package 200 is used in an inverter device, which is configured to convert direct current (DC) into alternating current (AC). In such an application, the drain (not shown) of semiconductor device 202 (e.g., a MOSFET) can sit at a very high voltage (e.g., 600 V). Due to the switching activity of semiconductor device 202, the combination of the current and resistances in semiconductor device 202 can cause semiconductor device 202 to generate significant heat, which needs to be dissipated/removed by heat sink 210 to improve semiconductor device 202's performance and those of electronic components around it. Given that metallic back surface 204 is electrically connected to the drain of semiconductor device 202, metallic back surface 204 also sits at a high voltage. As a result, metallic back surface 204 needs to be electrically insulated from heat sink 210, which is made of an electrically conductive material (e.g., a metal such as aluminum), in the process of transferring heat away from semiconductor device 202. Thermally conductive and electrically insulating layer 206 thus separates metallic back surface 204 from heat sink 210 but in a way that draws heat from semiconductor device 202 and towards heat sink 210.

In transistor package 200, molding 218 includes notch 212 on its flat, top surface. Notch 212 can engage, lock, or otherwise receive a mechanism that provides a clamp force towards metallic back surface 204. For example, molding 218 is made of an electrically insulating material such as plastic. While notch 212 is shown as a single recess in the example of FIG. 2, in other examples, notch 212 can be implemented as one or more recesses that can engage, lock, or otherwise receive a mechanism that provides clamp force 214 against the top surface of molding 218. The purpose of clamp force 214 is to reduce the air pockets between thermally conductive and electrically insulating layer 206 of transistor package 200 and thermal interface material 208 and therefore, lower thermal resistance between the adjacent layers and ultimately improve heat transfer from semiconductor device 202 to heat sink 210. In some embodiments, notch 212 comprises one or more circular recesses. For example, clamp force 214 comprises a spring-loaded pin or plunger that is supported by a gantry structure that is fastened into heat sink 210. The gantry structure can hold a respective spring-loaded pin or plunger in place over each transistor package such as transistor package 200 and the end of the spring-loaded pin or plunger can be inserted, locked into, or otherwise engaged with notch 212. In some embodiments, notch 212 comprises one or more non-circular recesses, such as square(s), slot(s), cross(es), and polygon(s), for example, that the mechanism providing clamp force 214 (e.g., a spring-loaded pin or plunger that is supported by a gantry structure) can lock into and prevent transistor package 200 from undesirable rotation about notch 212. In contrast to through-hole 118 of conventional transistor package 100 of FIG. 1, notch 212 is not a hole through the entire depth of molding 218. As a result, notch 212 does not have an opening on metallic back surface 204 and therefore, provides more area for metallic back surface 204 to transfer heat away from semiconductor device 202. Also, in contrast to through-hole 118 of conventional transistor package 100 of FIG. 1, notch 212 is located over semiconductor device 202 or is otherwise centrally located on the top surface of molding 218 such that the force of clamp force 214 can be more uniformly distributed across thermally conductive and electrically insulating layer 206 of transistor package 200. Uniform distribution of force across the area of thermally conductive and electrically insulating layer 206 of transistor package 200 can prevent an end of transistor package 200 from lifting up and allowing air pockets to form between thermally conductive and electrically insulating layer 206 and thermal interface material 208, which would increase thermal resistance and degrade heat transfer from semiconductor device 202 to heat sink 210. In some embodiments, the center or centroid of (e.g., the one or more recesses that form) notch 212 can be located at the geometric center (e.g., within a predetermined margin) of the top surface of molding 218.

As shown in FIG. 2, transistor package 200 includes thermally conductive and electrically insulating layer 206 that is adjacent to metallic back surface 204. In various embodiments, thermally conductive and electrically insulating layer 206 is physically attached to metallic back surface 204. For example, thermally conductive and electrically insulating layer 206 can be grown on top of metallic back surface 204 during the manufacturing process, such as via plasma-enhanced chemical vapor deposition (PECVD) or atomic layer deposition (ALD). For example, thermally conductive and electrically insulating layer 206 can be grown on a wafer in the cleanroom. For example, thermally conductive and electrically insulating layer 206 can be grown on top of metallic back surface 204 via PECVD or ALD and any additional area of thermally conductive and electrically insulating layer 206 that is not needed for a transistor package 200 can be etched away. Examples of thermally conductive and electrically insulating layer 206 can be aluminum nitride (AlN), silicon dioxide (SiO2), diamond, any dielectric, or a special organic substance that possesses thermally conductive but electrically insulating properties. In some embodiments, the area of thermally conductive and electrically insulating layer 206 equals to or is greater than the area of metallic back surface 204. By physically coating (e.g., via chemical vapor deposition) thermally conductive and electrically insulating layer 206, the thermal resistance between thermally conductive and electrically insulating layer 206 and metallic back surface 204 is lowered and thermally conductive and electrically insulating layer 206 performs better heat transfer than if thermally conductive and electrically insulating layer 206 were not physically attached to metallic back surface 204 but merely placed adjacently to each other with a layer of thermal interface material in between.

In the example shown in FIG. 2, thermally conductive and electrically insulating layer 206 of transistor package 200 can be placed adjacent to heat sink 210 with thermal interface material 208 applied in between to complete the transfer of heat from semiconductor device 202 to heat sink 210.

Figure 3:
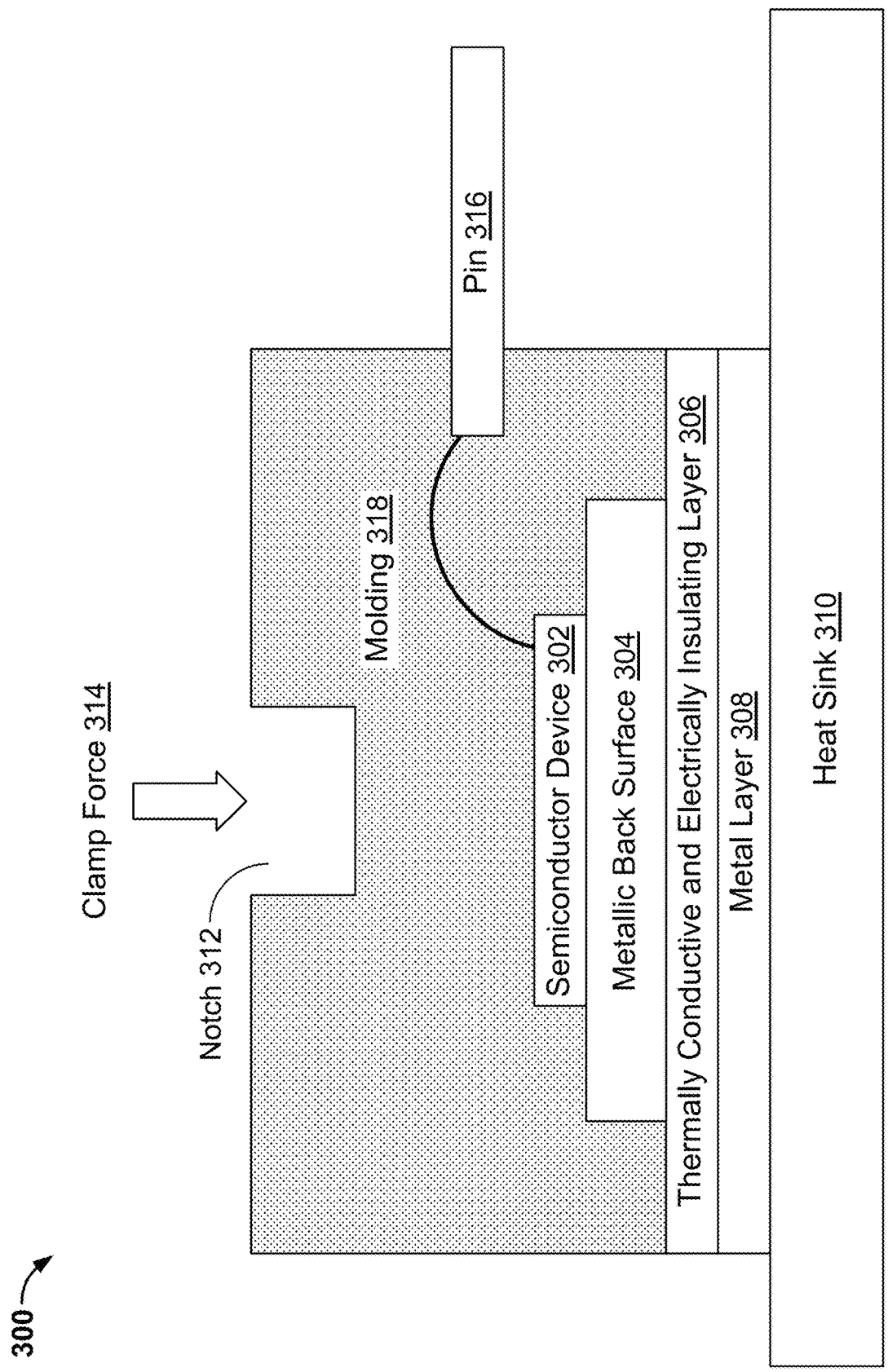
FIG. 3 is a diagram showing a length-wise cross-sectional view of another transistor package in accordance with some embodiments.

FIG. 3 is a diagram showing a length-wise cross-sectional view of another transistor package in accordance with some embodiments. Transistor package 300 includes semiconductor device 302, metallic back surface 304, pin 316, molding 318, thermally conductive and electrically insulating layer 306, and metal layer 308. Transistor package 300 is similar to transistor package 200 of FIG. 2 except that transistor package 300 includes additional metal layer 308 and excludes thermal interface material 208. Put another way, semiconductor device 302, metallic back surface 304, thermally conductive and electrically insulating layer 306, molding 318, notch 312, and pin 316 are similar to semiconductor device 202, metallic back surface 204, thermally conductive and electrically insulating layer 206, molding 218, notch 212, and pin 216 of transistor package 200 but transistor package 300 additionally includes metal layer 308 that is physically attached to thermally conductive and electrically insulating layer 306. In some embodiments, metal layer 308 can be grown on top of thermally conductive and electrically insulating layer 306 during the manufacturing process, such as via electroplating, evaporation, or sputtering. In some embodiments, metal layer 308 can also be bonded to thermally conductive and electrically insulating layer 306 via adhesive, cement, or via a metallic attach process such as brazing, soldering, or direct bonded copper (DBC). For example, metal layer 308 comprises copper or another type of metal. In some embodiments, metal layer 308 has an area that is at least the area of thermally conductive and electrically insulating layer 306. The advantage of coating metal layer 308 on top of thermally conductive and electrically insulating layer 306 is that the thermal resistance will be lower between the layers than if thermal interface material were added between the layers. Another advantage of coating metal layer 308 on top of thermally conductive and electrically insulating layer 306 is that metal layer 308 of transistor package 300 could be directly attached to heat sink 310. For example, metal layer 308 could be soldered or sintered onto heat sink 310, which is also made of metal such as aluminum. Either soldering or sintering metal layer 308 directly onto heat sink 310 provides greater thermal conductivity between the two layers than if a thermal interface material were applied between the adjacent layers because soldering/sintering would minimize the presence of air pockets (which would increase thermal resistance). As such, the addition of coating of metal layer 308 on thermally conductive and electrically insulating layer 306 improves the overall thermal conductivity (heat transfer) from semiconductor device 302 to heat sink 310 by eliminating the application of thermal interface material on either the top or bottom surfaces of thermally conductive and electrically insulating layer 306 and by allowing metal layer 308 to be physically attached to heat sink 310. A mechanism that provides clamp force 314 can still optionally engage/lock with notch 312 to secure transistor package 300 in place and minimize the presence of air pockets between adjacent layers between a heat generating source, semiconductor device 302, and heat sink 310.

FIGS. 4A-4E are diagrams that show overhead views of different example arrangements and shapes of recesses on the top surface of the molding of a transistor package in accordance with some embodiments.

Figure 4A:
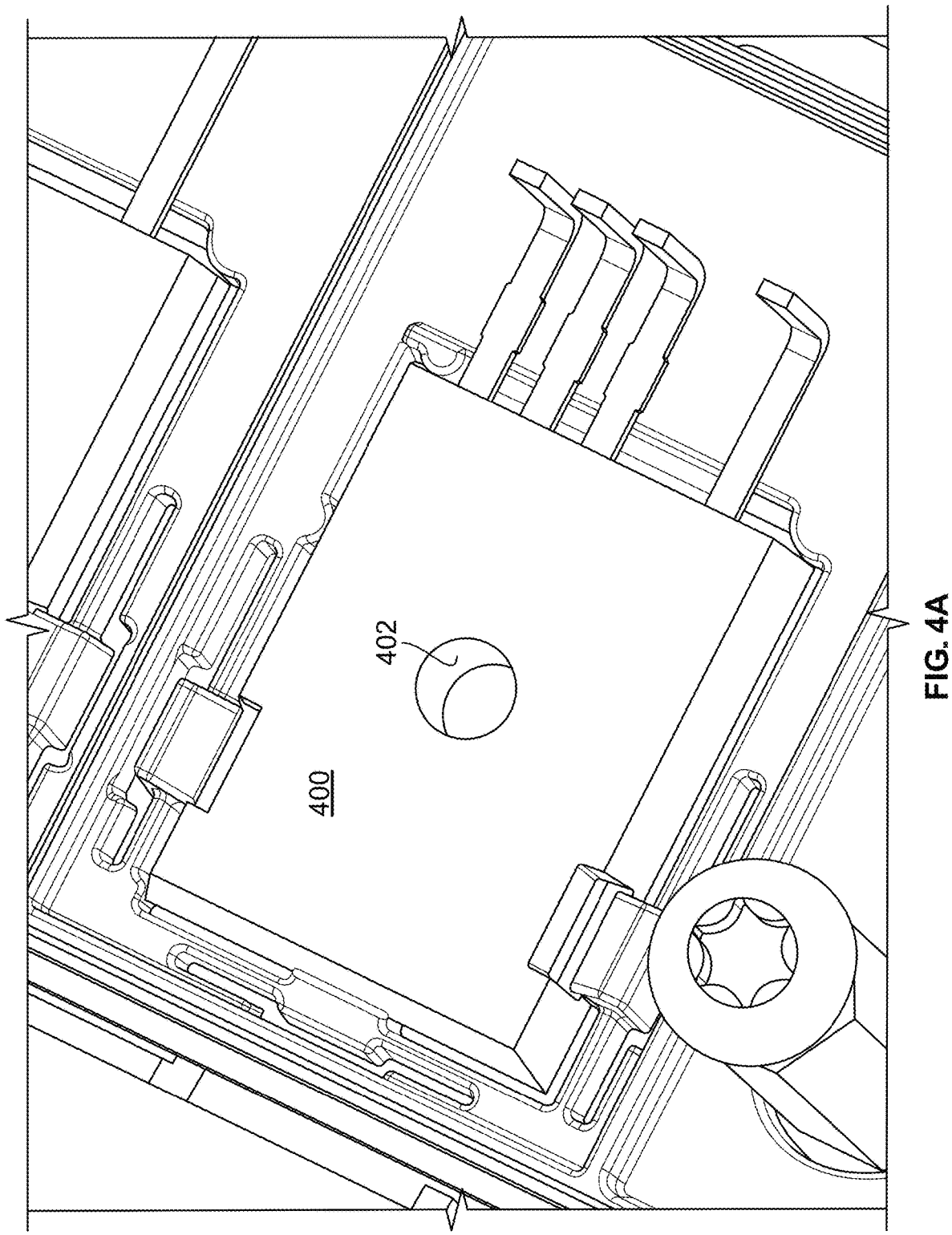
FIG. 4A is a diagram showing a single, circular recess on the top surface of the molding of a transistor package.

FIG. 4A is a diagram showing a single, circular recess on the top surface of the molding of a transistor package. For example, FIG. 4A can show the overhead view of either transistor package 200 of FIG. 2 or transistor package 300 of FIG. 3. As shown in FIG. 4A, notch 402 is located in the geometric center of top surface 400 of the molding of the transistor package and comprises a single, circular recess. The centered circular recess (notch 402) provides uniform distribution of a clamp force but does not prevent the transistor package from potentially rotating.

Figure 4B:
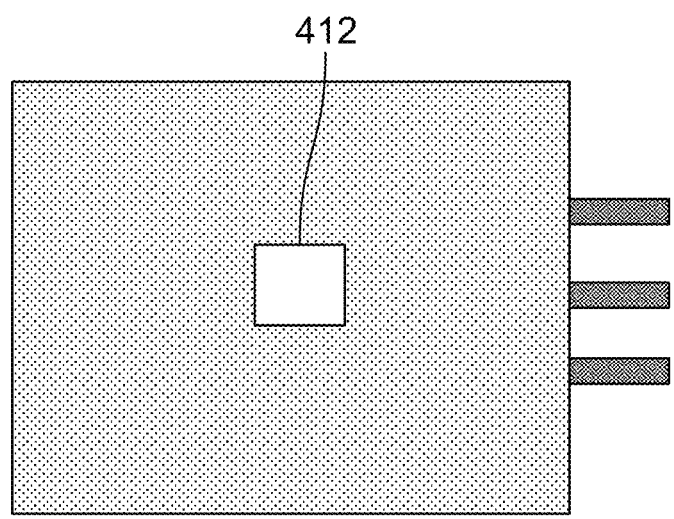
FIG. 4B is a diagram showing a single, rectangular recess on the top surface of the molding of a transistor package.

FIG. 4B is a diagram showing a single, rectangular recess on the top surface of the molding of a transistor package. For example, FIG. 4B can show the overhead view of either transistor package 200 of FIG. 2 or transistor package 300 of FIG. 3. As shown in FIG. 4B, notch 412 is located in the geometric center of the top surface of the molding of the transistor package and comprises a single, rectangular recess. The centered rectangular recess (notch 412) provides uniform distribution of a clamp force and also prevents the transistor package from potentially rotating because the rectangular shape will lock the position of a mechanism that is providing the clamp force. While notch 412 is shown to be a rectangular shape in FIG. 4B, in other examples, notch 412 can take on other shapes such as a triangle, an oval, or a hexagon to similarly reduce the risk of rotation.

Figure 4C:
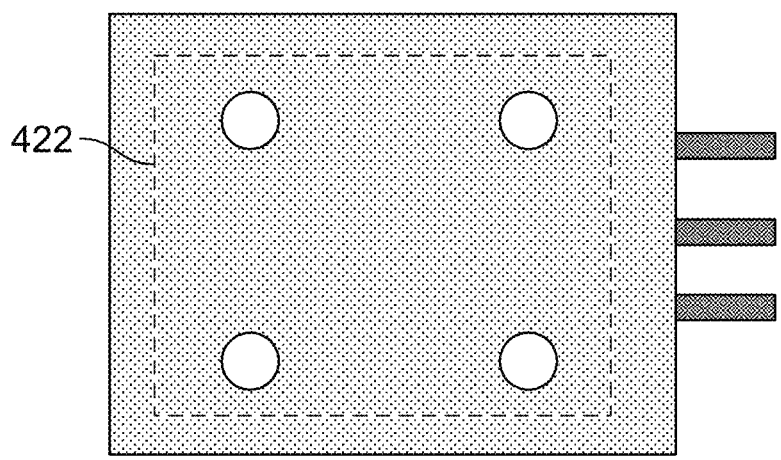
FIG. 4C is a diagram showing multiple circular recesses on the top surface of the molding of a transistor package.

FIG. 4C is a diagram showing multiple circular recesses on the top surface of the molding of a transistor package. For example, FIG. 4C can show the overhead view of either transistor package 200 of FIG. 2 or transistor package 300 of FIG. 3. As shown in FIG. 4C, notch 422 comprises four circular recesses. For example, the centroid of the four circular recesses is the geometric center of the top surface of the molding of the transistor package. The four circular recesses provide uniform distribution of a clamp force and also prevents the transistor package from potentially rotating because a mechanism that is providing the clamp force will engage with all four recesses.

Figure 4D:
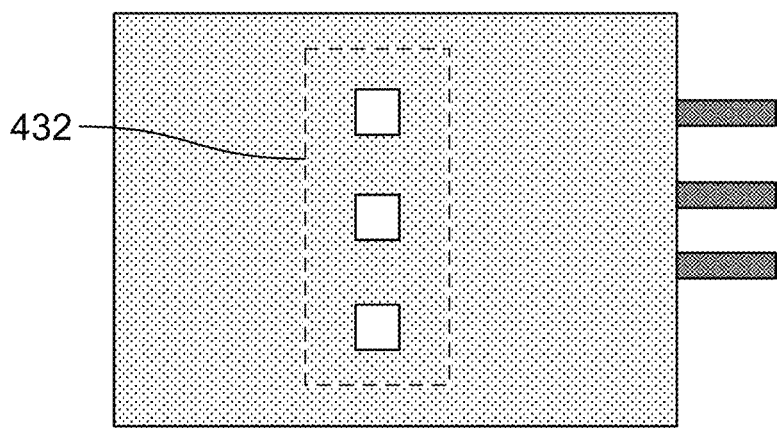
FIG. 4D is a diagram showing multiple rectangular recesses on the top surface of the molding of a transistor package.

FIG. 4D is a diagram showing multiple rectangular recesses on the top surface of the molding of a transistor package. For example, FIG. 4D can show the overhead view of either transistor package 200 of FIG. 2 or transistor package 300 of FIG. 3. As shown in FIG. 4D, notch 432 comprises a column of three rectangular recesses. For example, the centroid of the three rectangular recesses is the geometric center of the top surface of the molding of the transistor package. The three rectangular recesses provide uniform distribution of a clamp force and also prevents the transistor package from potentially rotating because a mechanism that is providing the clamp force will engage with all three rectangular recesses.

Figure 4E:
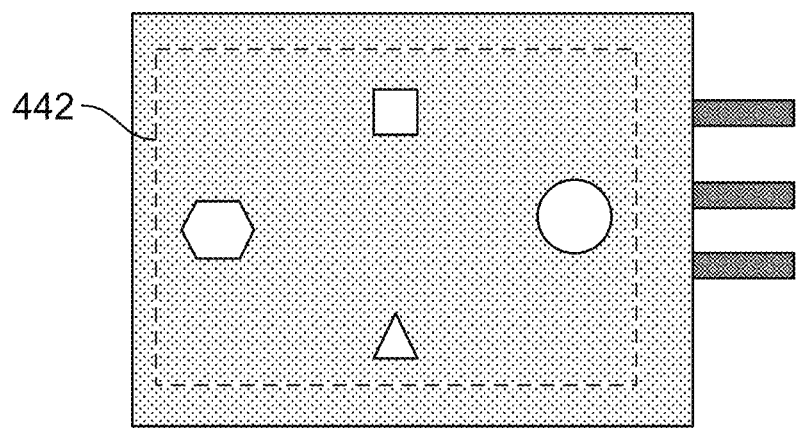
FIG. 4E is a diagram showing multiple recesses of different shapes on the top surface of the molding of a transistor package.

FIG. 4E is a diagram showing multiple recesses of different shapes on the top surface of the molding of a transistor package. For example, FIG. 4E can show the overhead view of either transistor package 200 of FIG. 2 or transistor package 300 of FIG. 3. As shown in FIG. 4E, notch 432 comprises four recesses of varying shapes. For example, the centroid of the four recesses is the geometric center of the top surface of the molding of the transistor package. The four recesses of varying shapes provides uniform distribution of a clamp force and also prevents the transistor package from potentially rotating because a mechanism that is providing the clamp force will engage with all four recesses. While FIG. 4E shows four recesses comprising a rectangular, a hexagon, a triangle, and a circle, in other examples, the recesses can have any combination of shapes.

FIG. 5 is a diagram showing a cross-sectional view of a mechanism that provides a clamp force on a transistor package in accordance with some embodiments. Transistor package 508 is shown as a length-wise cross section. For example, transistor package 508 can represent transistor package 200 of FIG. 2 or transistor package 300 of FIG. 3. Notch 506 is centrally located within the top surface of transistor package 508 and/or located above the transistor within transistor package 508. Gantry structure 502, which is fastened into heat sink 510 via screws (not shown) supports spring-loaded pins such as pin 504 that each provides a clamp force down on a respective transistor. The tip of pin 504 is engaged in notch 506, which locks the location of pin 504 and also ensures that the clamp force from pin 504 can be uniformly distributed across transistor package 508 and thereby eliminate air pockets (which create thermal resistance) between transistor package 508 and heat sink 510. In some embodiments, the combination of a gantry structure supporting a spring-loaded pin to provide a consistent clamp force down on a transistor can be found in an inverter device.

Figure 6:
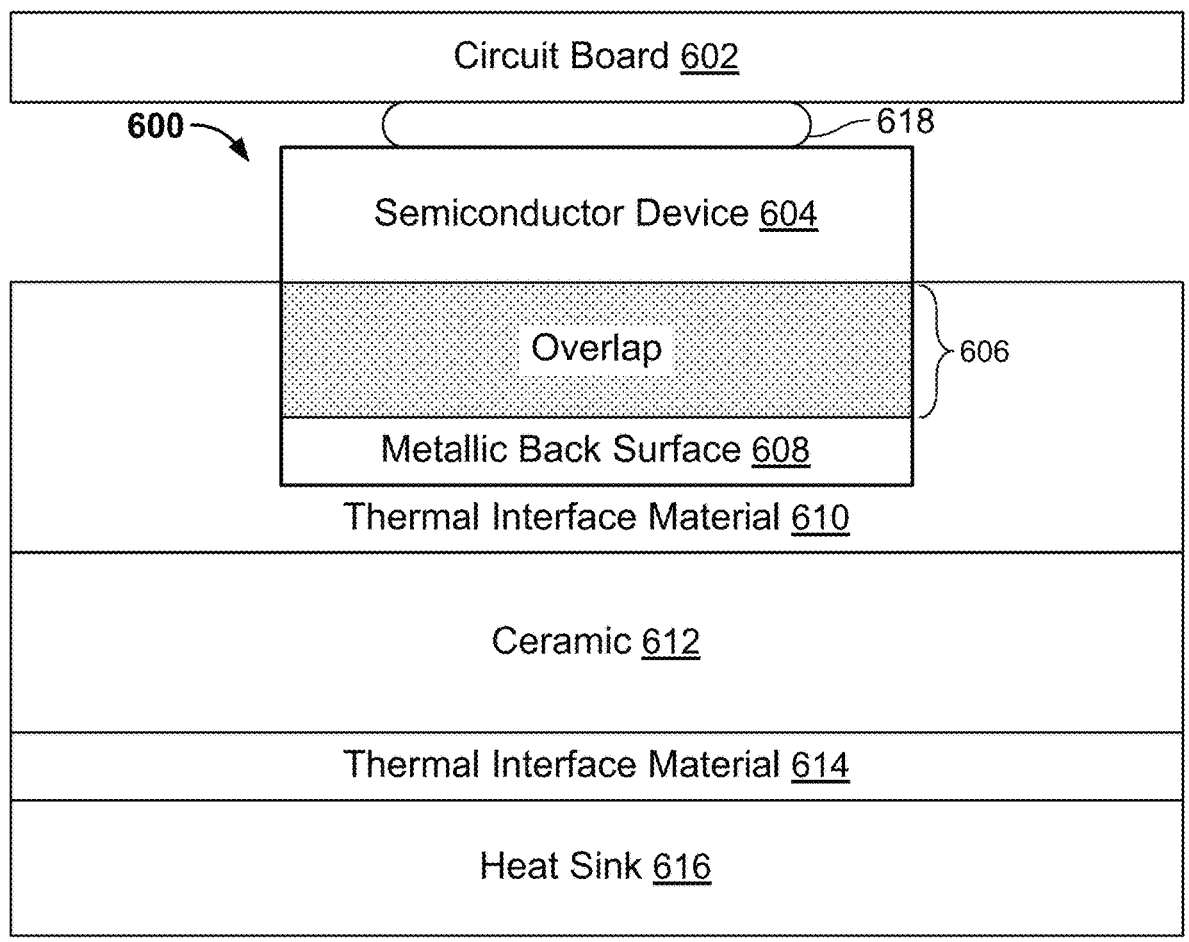
FIG. 6 is a diagram showing a cross-sectional view of another conventional transistor package.

FIG. 6 is a diagram showing a cross-sectional view of another conventional transistor package. Traditional transistor package 600 includes semiconductor device 604 and metallic back surface 608. Unlike conventional transistor package 100 of FIG. 1, transistor package 600 does not include a molding or pins that can be connected to a circuit board. Instead, transistor package 600 includes solder bumps 618 on its top surface that allow transistor package 600 to be soldered ("surface mounted") onto circuit board 602. An example of such a surface mount type of transistor is a gallium nitride FET. For example, semiconductor device 604 is used in a maximizer device that converts DC to DC to ensure peak efficiency and then outputs the DC to an inverter device. Semiconductor device 604 includes a source, gate, and drain (not shown). Metallic back surface of semiconductor device 608 is electrically connected to the drain and therefore sits at the voltage of the drain. For example, metallic back surface 608 sits at a high voltage, such as up to 400 V. As such, the significant heat that is generated by semiconductor device 604 will need to be removed in a way that also electrically insulates metallic back surface 608. As such, ceramic 612, which is a thermally conductive but electrically insulating material, is placed under metallic back surface 608 of transistor package 600 to transfer heat away from semiconductor device 604. Thermal interface material 610 is applied between metallic back surface 608 and ceramic 612 to reduce the thermal resistance between the two layers. Furthermore, heat sink 616, which is made of metal, is placed under ceramic 612 to draw heat away from ceramic 612. Similarly, thermal interface material 614 is applied between ceramic 612 and heat sink 616 to reduce the thermal resistance between the two layers.

However, traditional transistor package 600 of a surface mount transistor, semiconductor device 604, includes several drawbacks. The first drawback is the space between semiconductor device 604 and ceramic 612. This space is necessary because there is spacing for assembly tolerance between what is often an array of semiconductor devices and ceramic heat spreaders. While thermal interface material 610 is added between metallic back surface 608 of semiconductor device 604 and ceramic 612, due to the soft texture of thermal interface material 610 and the force that is placed on circuit board 602 during assembly to ensure good contact between circuit board 602 and solder bumps 618, semiconductor device 604 is often squeezed into thermal interface material 610 to create overlap 606. The second drawback is that while thermal interface materials (610 and 614) reduce the thermal resistance between their adjacent layers, thermal interface materials do not eliminate the presence of air pockets, which still provide considerable and undesirable thermal resistance.

Figure 7:
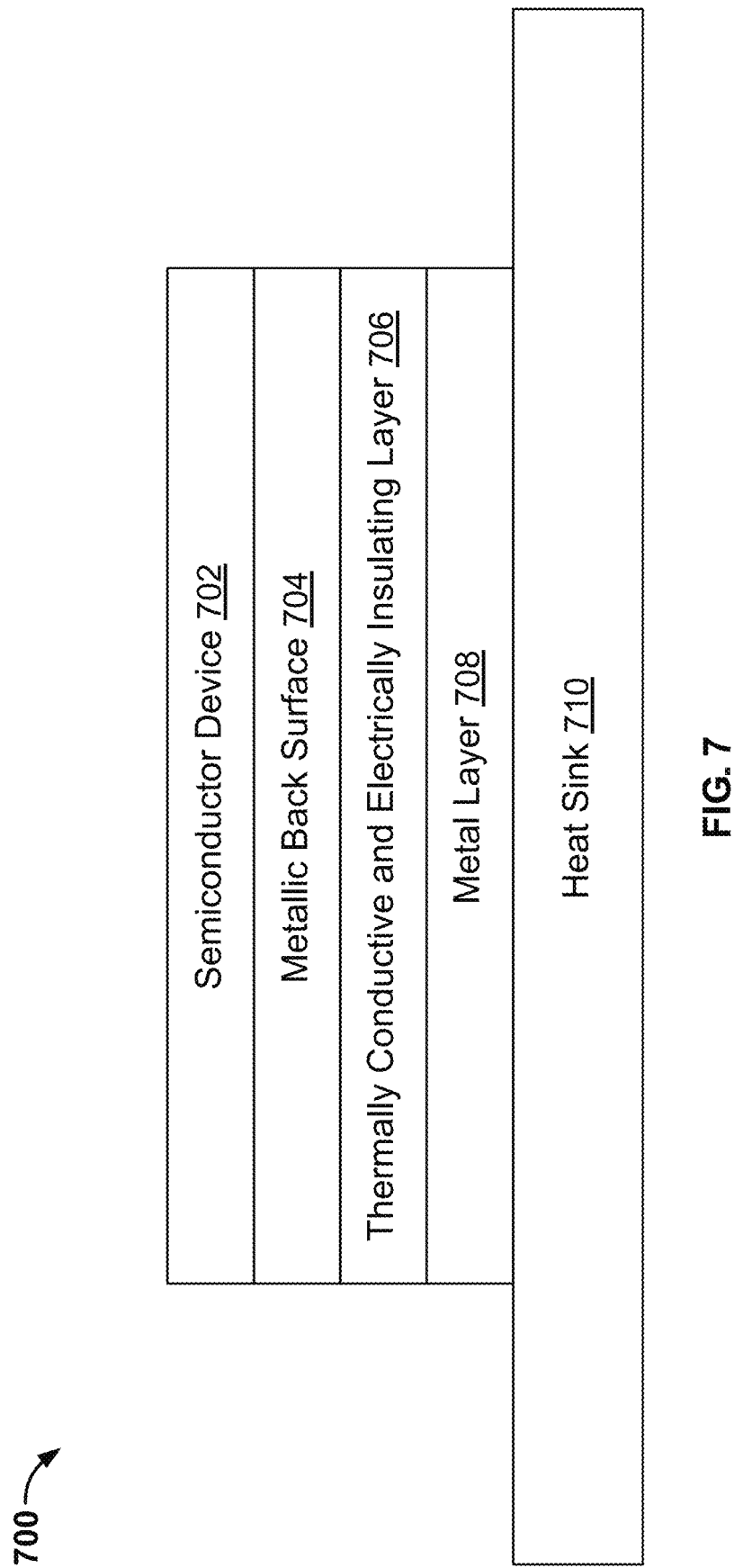
FIG. 7 is a diagram showing a cross-sectional view of a transistor package in accordance with some embodiments.

FIG. 7 is a diagram showing a cross-sectional view of a transistor package in accordance with some embodiments. In various embodiments, transistor package 700 includes semiconductor device 702, metallic back surface 704, thermally conductive and electrically insulating layer 706, and metal layer 708. In some embodiments, transistor package 700 can be used for a surface mount transistor such as a gallium nitride FET that does not include a molding over semiconductor device 702. In transistor package 700, thermally conductive but electrically insulating layer 706 is physically attached to metallic back surface 704. For example, thermally conductive but electrically insulating layer 706 is deposited onto metallic back surface 704 during the manufacturing process via PECVD or ALD. The dimensions of thermally conductive but electrically insulating layer 706 were determined through etching thermally conductive but electrically insulating layer 706 to the desired pattern/size. Similarly, metal layer 708 is physically attached to thermally conductive but electrically insulating layer 706. For example, metal layer 708, which can be copper, can also be deposited onto thermally conductive but electrically insulating layer 706 during the manufacturing process via electroplating, evaporation, or sputtering. In some embodiments, metal layer 708 can also be bonded to thermally conductive and electrically insulating layer 706 via adhesive, cement, or via a metallic attach process such as brazing, soldering, or direct bonded copper (DBC). The advantage of coating metal layer 708 on top of thermally conductive and electrically insulating layer 706 is that the thermal resistance will be lower between the layers than if thermal interface material were added between the layers. Another advantage of coating metal layer 708 on top of thermally conductive and electrically insulating layer 706 is that metal layer 708 of transistor package 700 could be directly attached to heat sink 710. For example, metal layer 708 could be soldered or sintered onto heat sink 710, which is also made of metal such as aluminum. Either soldering or sintering metal layer 708 directly onto heat sink 710 provides greater thermal conductivity between the two layers than if a thermal interface material were applied between the adjacent layers because soldering/sintering would minimize the presence of air pockets (which would increase thermal resistance). As such, the addition of coating of metal layer 708 on thermally conductive and electrically insulating layer 706 improves the overall thermal conductivity (heat transfer) from semiconductor device 702 to heat sink 710 by eliminating the application of thermal interface material on either the top or bottom surfaces of thermally conductive and electrically insulating layer 706 and by allowing metal layer 708 to be physically attached to heat sink 710.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An electronic component, comprising:
   a transistor comprising:
      a source; and
      a drain; and
   a package comprising:
      a metallic back surface that is electrically connected to the drain;
      a top surface of a molding over the transistor, wherein the top surface comprises a notch, wherein the notch comprises one or more recesses, wherein the one or more recesses comprise at least one non-circular recess or a plurality of circular recesses that are to engage with a corresponding clamp force mechanism against the top surface of the molding over the transistor in a manner that prevents rotation of the package, wherein the notch is not a through-hole that opens at the metallic back surface; and
      a thermally conductive and electrically insulating layer covering at least a portion of the metallic back surface of the package.

2. The electronic component of claim 1, wherein the notch is located over the transistor.

3. The electronic component of claim 1, wherein the at least one non-circular recess comprises a polygon.

4. The electronic component of claim 1, wherein the corresponding clamp force mechanism comprises a spring-loaded pin or plunger.

5. The electronic component of claim 4, wherein the corresponding clamp force mechanism is supported by a gantry structure.

6. The electronic component of claim 1, wherein the thermally conductive and electrically insulating layer is deposited onto the metallic back surface.

7. The electronic component of claim 1, wherein the package further includes a metal layer covering at least a portion of the thermally conductive and electrically insulating layer.

8. The electronic component of claim 7, wherein the metal layer is deposited onto the thermally conductive and electrically insulating layer.

9. The electronic component of claim 7, wherein the metal layer comprises copper.

10. The electronic component of claim 7, wherein the metal layer is to be physically soldered or sintered to a heat sink.

11. The electronic component of claim 1, wherein the thermally conductive and electrically insulating layer comprises one or more of the following: aluminum nitride, silicon dioxide, and diamond.

* * * * *